(12) United States Patent
Kweon et al.

(10) Patent No.: US 11,854,893 B2
(45) Date of Patent: Dec. 26, 2023

(54) METHOD OF MANUFACTURING SEMICONDUCTOR PACKAGE

(71) Applicant: SAMSUNG ELECTRONICS CO., LTD., Suwon-si (KR)

(72) Inventors: Junyun Kweon, Cheonan-si (KR); Jumyong Park, Cheonan-si (KR); Solji Song, Suwon-si (KR); Dongjoon Oh, Suwon-si (KR); Chungsun Lee, Asan-si (KR); Hyunsu Hwang, Siheung-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/850,714

(22) Filed: Jun. 27, 2022

(65) Prior Publication Data

US 2023/0096678 A1 Mar. 30, 2023

(30) Foreign Application Priority Data

Sep. 27, 2021 (KR) .................. 10-2021-0127088

(51) Int. Cl.
*H01L 21/78* (2006.01)
*H01L 21/02* (2006.01)
*H01L 23/00* (2006.01)

(52) U.S. Cl.
CPC .......... *H01L 21/78* (2013.01); *H01L 21/0206* (2013.01); *H01L 24/80* (2013.01); *H01L 24/94* (2013.01); *H01L 24/97* (2013.01); *H01L 2224/80895* (2013.01); *H01L 2224/80896* (2013.01); *H01L 2224/94* (2013.01); *H01L 2224/97* (2013.01)

(58) Field of Classification Search
None
See application file for complete search history.

(56) References Cited

U.S. PATENT DOCUMENTS

| 8,298,883 | B2 * | 10/2012 | Zheng ................ H01L 27/1214 257/E21.411 |
| 8,800,475 | B2 | 8/2014 | Finn |
| 9,054,176 | B2 | 6/2015 | Lei et al. |
| 9,843,155 | B2 * | 12/2017 | Milne ................ B23K 26/0661 |
| 10,388,534 | B2 | 8/2019 | Takenouchi |
| 10,535,554 | B2 | 1/2020 | Tang et al. |
| 10,916,439 | B2 | 2/2021 | Yokoi et al. |

(Continued)

FOREIGN PATENT DOCUMENTS

| CN | 104319323 A * | 1/2015 | ............ H01L 33/005 |
| CN | 106077965 B * | 6/2018 | ....... B23K 2103/172 |

(Continued)

*Primary Examiner* — Michael Lebentritt
(74) *Attorney, Agent, or Firm* — Fish & Richardson P.C.

(57) ABSTRACT

A method of manufacturing a semiconductor package, includes forming a mask layer on a wafer, the wafer including a semiconductor substrate and an insulating layer; forming a groove in the semiconductor substrate by performing a first laser grooving process; expanding an opening of the mask layer opened by the first laser grooving process by performing a second laser grooving process; exposing a portion of the insulating layer by removing a portion of the mask layer; and cutting the semiconductor substrate while removing the portion of the insulating layer exposed during the exposing by performing a dicing process.

20 Claims, 18 Drawing Sheets

(56) References Cited

U.S. PATENT DOCUMENTS

| | | | |
|---|---|---|---|
| 2010/0081256 A1* | 4/2010 | Uemura | H01L 33/0093 |
| | | | 257/E21.09 |
| 2016/0218067 A1* | 7/2016 | Masuko | H01L 23/562 |
| 2020/0168565 A1 | 5/2020 | Myung et al. | |
| 2021/0050262 A1 | 2/2021 | Balakrishnan et al. | |

FOREIGN PATENT DOCUMENTS

| | | | | |
|---|---|---|---|---|
| CN | 112397402 A | * | 2/2021 | ......... H01L 21/4825 |
| JP | 2008155225 A | * | 7/2008 | |
| JP | 2013239580 A | * | 11/2013 | |
| JP | 2020013927 A | * | 1/2020 | |
| JP | 2020027889 A | * | 2/2020 | |
| JP | 2021027254 A | * | 2/2021 | |
| KR | 10-2158832 B1 | | 5/2020 | |

\* cited by examiner

METHOD OF MANUFACTURING SEMICONDUCTOR PACKAGE

CROSS-REFERENCE TO RELATED APPLICATION

A claim of priority under 35 U.S.C. § 119 is made to Korean Patent Application No. 10-2021-0127088, filed on Sep. 27, 2021, in the Korean Intellectual Property Office, the entirety of which is hereby incorporated by reference.

BACKGROUND

The present disclosure relates to a method of manufacturing a semiconductor package.

Responsive to the trend of providing miniaturized, high performance semiconductor packages, there is a need to develop a system-in-package (SiP) technology in which a plurality of semiconductor chips performing different functions are embedded in a single package. In order to form a fine interconnection connecting the semiconductor chips in a package, a technology of forming a through silicon via (TSV) and bonding the semiconductor chips to each other through bonding pads is used.

SUMMARY

Embodiments of the inventive concepts provide a semiconductor package having improved electrical characteristics and reliability, and a method for manufacturing the same.

Embodiments of the inventive concepts provide a method of manufacturing a semiconductor package including forming a mask layer on a wafer, the wafer including a semiconductor substrate and an insulating layer; forming a groove in the semiconductor substrate by performing a first laser grooving process; expanding an opening of the mask layer opened by the first laser grooving process by performing a second laser grooving process; exposing a portion of the insulating layer by removing a portion of the mask layer; and cutting the semiconductor substrate while removing the portion of the insulating layer exposed during the exposing by performing a dicing process.

Embodiments of the inventive concepts further provide a method of manufacturing a semiconductor package including forming a first structure including a first bonding structure; forming a second structure including a second bonding structure; and bonding the first structure and the second structure so that the first bonding structure and the second bonding structure are in direct contact with each other. At least one of the forming of the first structure and the forming of the second structure includes forming a mask layer on a wafer, the wafer including a semiconductor substrate and an insulating layer; forming a groove in the semiconductor substrate by performing a first laser grooving process; expanding an opening of the mask layer opened by the first laser grooving process by performing a second laser grooving process; exposing a portion of the insulating layer by removing a portion of the mask layer; cutting the semiconductor substrate while removing the portion of the insulating layer exposed during the exposing by performing a dicing process; and removing the mask layer.

Embodiments of the inventive concepts still further provide a method of manufacturing a semiconductor package including forming a first structure including a plurality of semiconductor structures; forming a second structure including a semiconductor chip; and bonding the second structure to the first structure. The forming of the second structure includes forming a mask layer on a wafer, the wafer including a semiconductor substrate and an insulating layer; forming a groove in the semiconductor substrate by performing a first laser grooving process along a scribe lane of the semiconductor substrate; removing a portion of the mask layer by performing a second laser grooving process on a region larger than a region of the first laser grooving process; removing residue of the mask layer remaining on the insulating layer after the second laser grooving process; forming a plurality of semiconductor chips including the semiconductor chip by performing a dicing process using the mask layer as an etching mask; and removing the mask layer.

Embodiments of the inventive concepts also provide a semiconductor package including a semiconductor structure including a first semiconductor layer, a through via penetrating through the first semiconductor layer, a first bonding pad connected to the through via, and a first bonding insulating layer on side surfaces of the first bonding pad; and a semiconductor chip disposed on the semiconductor structure, and including a second semiconductor layer, a second bonding pad disposed below the second semiconductor layer and directly bonded to the first bonding pad, and a second bonding insulating layer disposed on side surfaces of the second bonding pad and directly bonded to the first bonding insulating layer. In at least one of the first semiconductor layer and the second semiconductor layer, a side surface thereof has an uneven surface.

Embodiments of the inventive concepts still further provide a method of manufacturing a semiconductor package including forming a mask layer on a wafer, the wafer including a semiconductor substrate, an insulating layer on the semiconductor substrate, chip regions and scribe lanes between the chip regions; forming an opening through the mask layer and the insulating layer along a scribe lane from among the scribe lanes, and a groove in the semiconductor substrate at the opening, by performing a first laser grooving process, the groove having a first width; expanding the opening at the mask layer to provide an expanded opening having a second width corresponding to a width of the scribe lanes, by performing a second laser grooving process; exposing a portion of the insulating layer by removing a portion of the mask layer remaining in the expanded opening; and cutting the semiconductor substrate and removing the portion of the insulating layer exposed during the exposing by performing a dicing process using the expanded opening of the mask layer.

BRIEF DESCRIPTION OF DRAWINGS

The above and other aspects, features, and advantages of the inventive concepts will be more clearly understood from the following detailed description taken in conjunction with the accompanying drawings, in which.

DETAILED DESCRIPTION

Hereinafter, preferred example embodiments of the inventive concepts will be described with reference to the accompanying drawings as follows.

Figure 1:
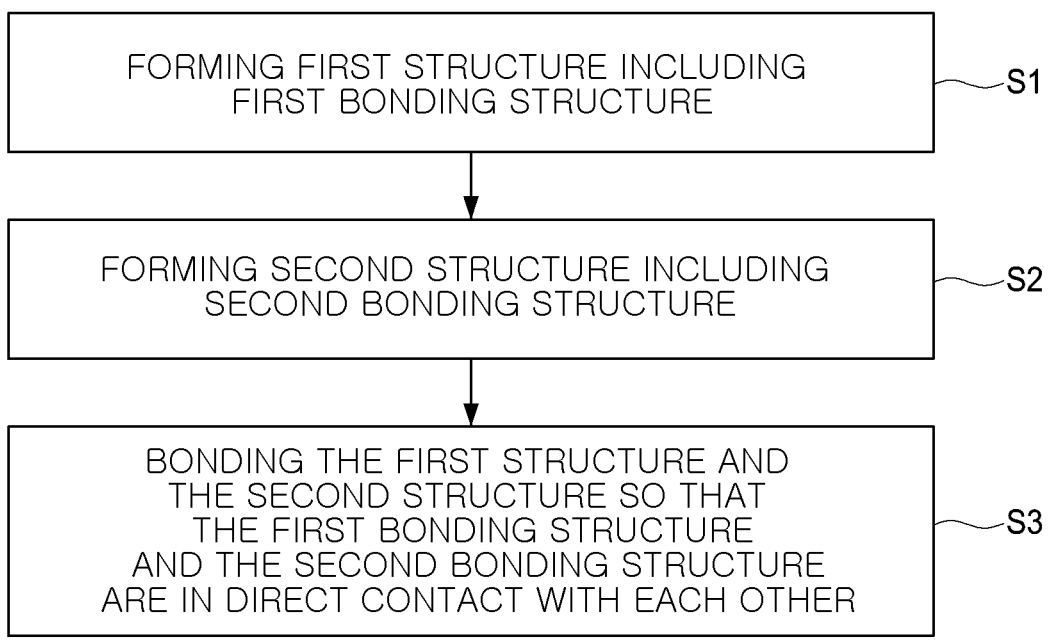
FIG. 1 illustrates a flowchart of a method of manufacturing a semiconductor package according to a process sequence, according to embodiments of the inventive concepts.
Figure 2:
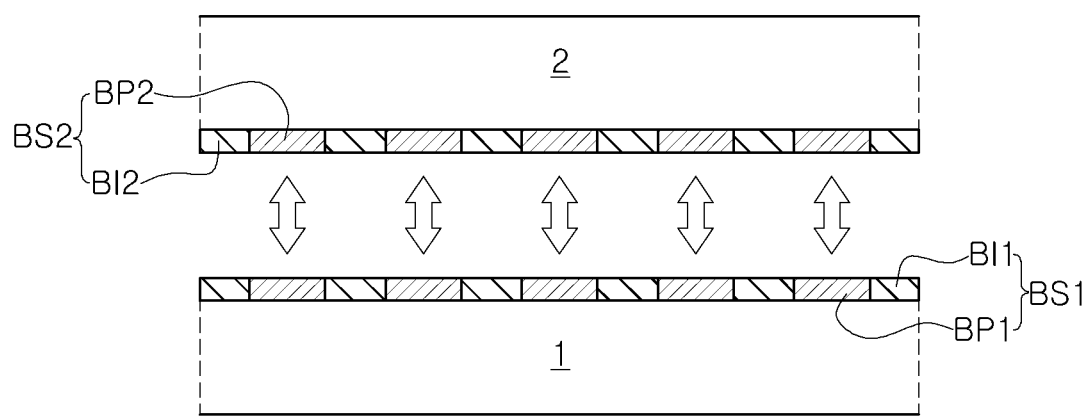
FIG. 2 illustrates a bonding process of a first structure and a second structure explanatory of a method of manufacturing a semiconductor package according to embodiments of the inventive concepts.

FIG. 1 illustrates a flowchart of a method of manufacturing a semiconductor package according to a process sequence, according to embodiments of the inventive concepts. FIG. 2 illustrates a bonding process of a first structure 1 and a second structure 2 explanatory of a method of manufacturing a semiconductor package according to embodiments of the inventive concepts.

Referring to FIGS. 1 and 2, a first structure 1 including a first bonding structure BS1 may be formed (S1), a second structure 2 including a second bonding structure BS2 may be formed (S2), and the first structure 1 and the second structure 2 may be bonded so that the first bonding structure BS1 and the second bonding structure BS2 are in direct contact with each other (S3).

The first bonding structure BS1 may include one or more first bonding pads BP1 and a first bonding insulating layer BI1 surrounding at least a portion of side surfaces of the first bonding pad(s) BP1, and the second bonding structure BS2 may include one or more second bonding pads BP2 and a second bonding insulating layer BI2 surrounding at least a portion of side surfaces of the second bonding pad(s) BP2. The first bonding pads BP1 and the second bonding pads BP2 may be in contact with each other after bonding of the first structure 1 and the second structure 2, and may be coupled by copper (Cu)-to-copper (Cu) bonding. The first bonding insulating layer BI1 and the second bonding insulating layer BI2 may be in contact with each other after bonding of the first structure 1 and the second structure 2, and may be coupled by dielectric-to-dielectric bonding. The first bonding structure BS1 and the second bonding structure BS2 may be electrically connected to a redistribution layer or a through-via disposed in each of the first structure 1 and the second structure 2.

In an example embodiment, the bonding of the first structure 1 and the second structure 2 may be die-to-die bonding or die-to-wafer bonding. For example, when each of the first structure 1 and the second structure 2 is a semiconductor chip, the bonding of the first structure 1 and the second structure 2 may be a die-to-die bonding. For example, when the first structure 1 is one of a plurality of semiconductor structures divided by a scribe lane on a semiconductor wafer, and the second structure 2 is a semiconductor chip disposed above each of the plurality of semiconductor structures, the bonding of the first structure 1 and the second structure 2 may be a die-to-wafer bonding. For example, when the first structure 1 and the second structure 2 are one of a plurality of semiconductor structures divided by a scribe lane on each of a first semiconductor wafer and a second semiconductor wafer, the bonding of the first structure 1 and the second structure 2 may be wafer-to-wafer bonding.

According to example embodiments of the inventive concepts, at least one of the first bonding structure BS1 and the second bonding structure BS2 may include a flat bonding surface without unevenness, provided by removing burrs formed on the insulating layer when a following laser grooving process is performed in a dicing process.

Hereinafter, a method of manufacturing at least one of the first structure 1 and the second structure 2 will be described.

Figure 3:
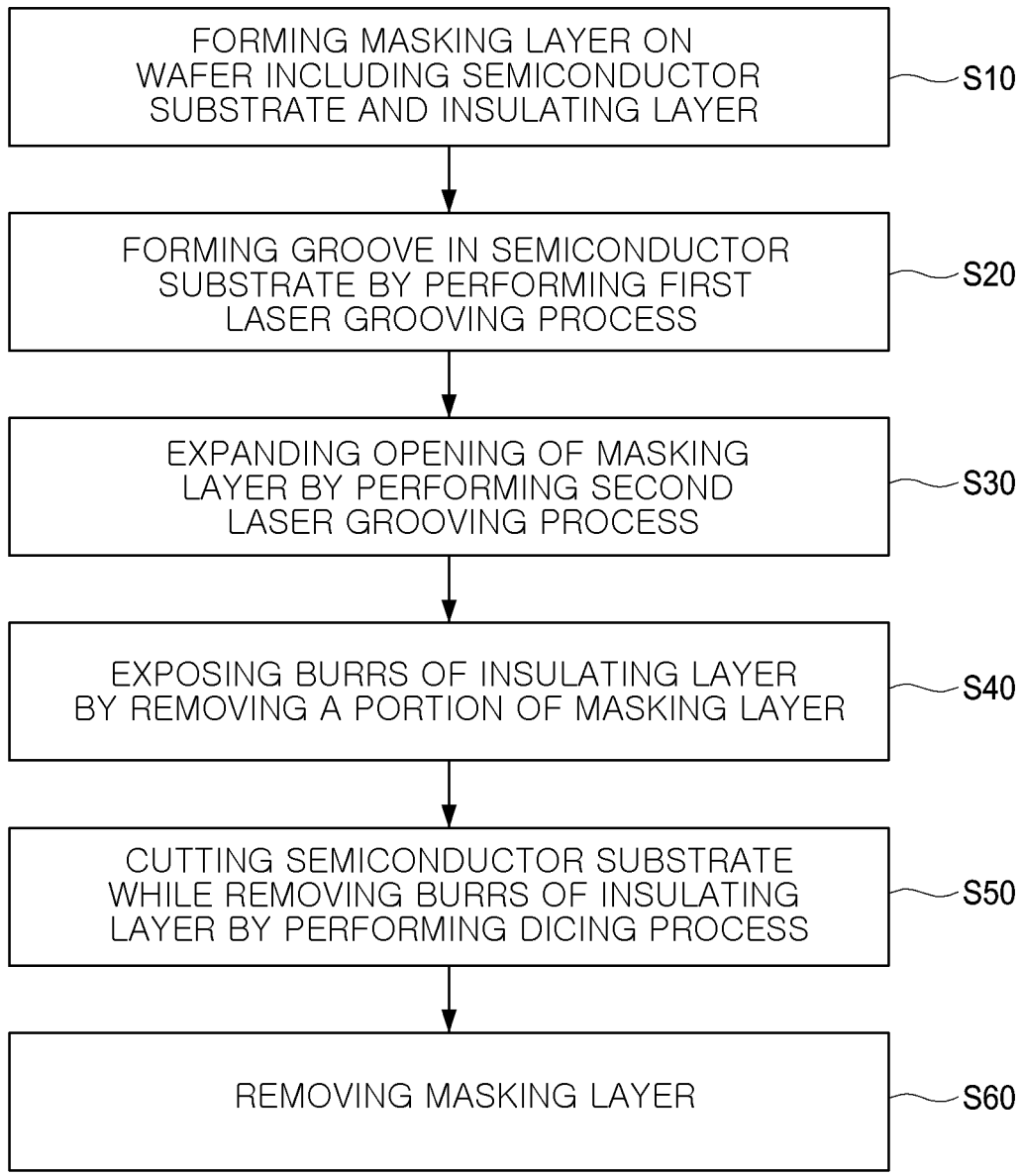
FIG. 3 illustrates a flowchart of a method of manufacturing a semiconductor package according to a process sequence, according to embodiments of the inventive concepts.

FIG. 3 illustrates a flowchart of a method of manufacturing a semiconductor package according to a process sequence, according to embodiments of the inventive concepts.

Figure 4A:
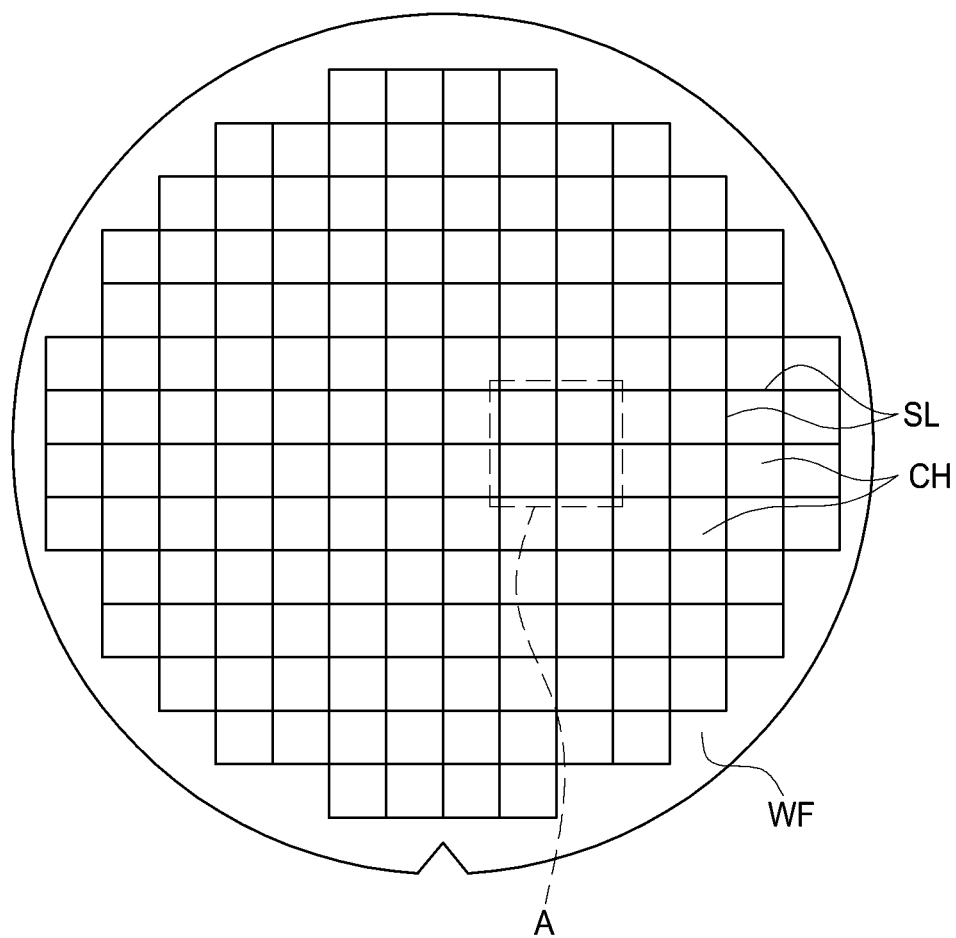
FIGS. 4A and 4B respectively illustrate a top plan view of a wafer and an enlarged view of region 'A' of the wafer explanatory of a method of manufacturing a semiconductor package according to embodiments of the inventive concepts.
Figure 4B:
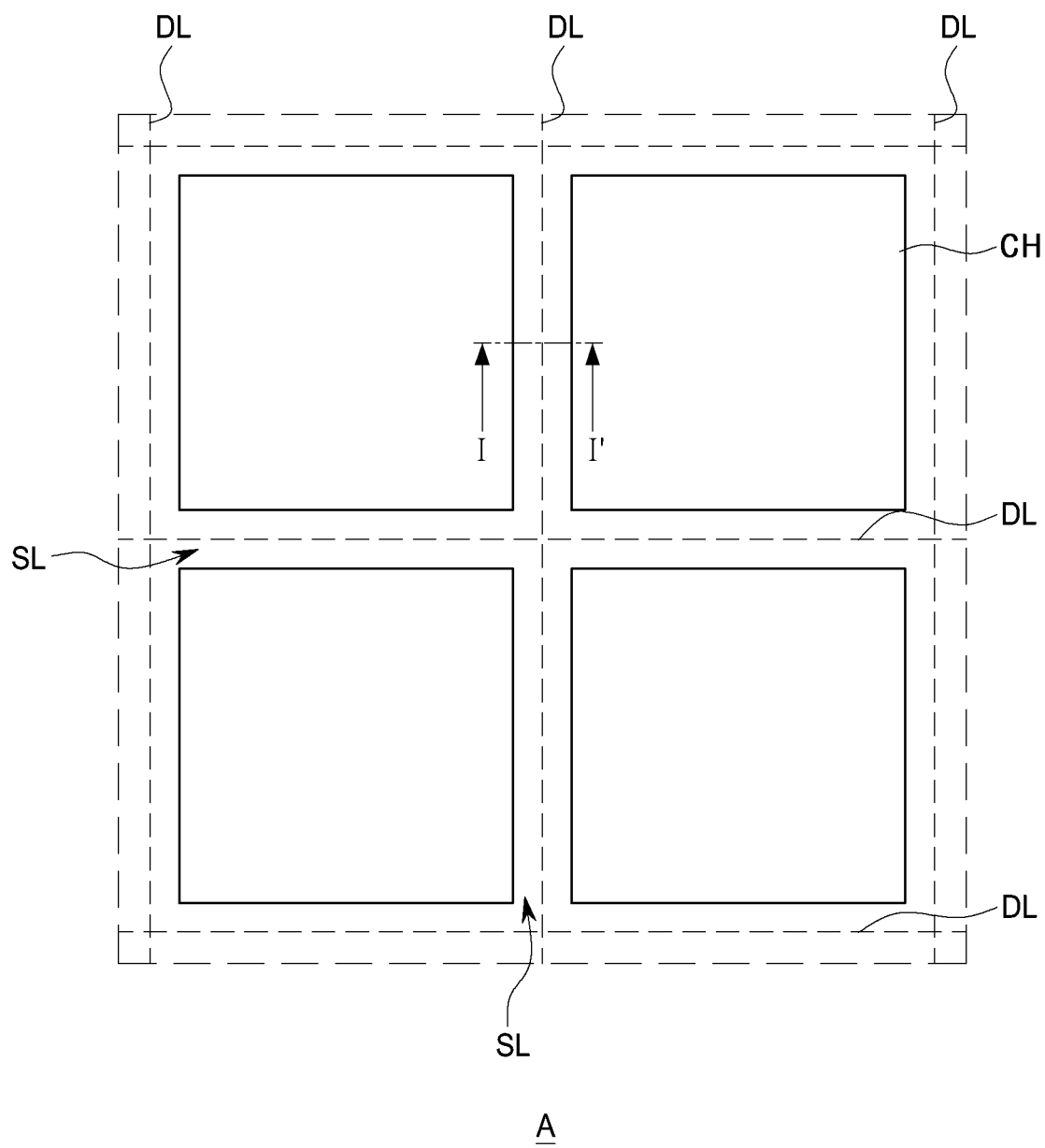

FIGS. 4A and 4B are top plan views of a wafer, and FIGS. 5 to 9B are cross-sectional views sequentially showing manufacturing processes explanatory of a method of manufacturing a semiconductor package according to embodiments of the inventive concepts. In particular, FIG. 4B illustrates an enlarged view of region 'A' of FIG. 4A, and FIGS. 5 to 9B illustrate a process in which a wafer is diced from a cross-section along the cutting line I-I' of FIG. 4B to form the wafer into a plurality of semiconductor chips.

Figure 8A:
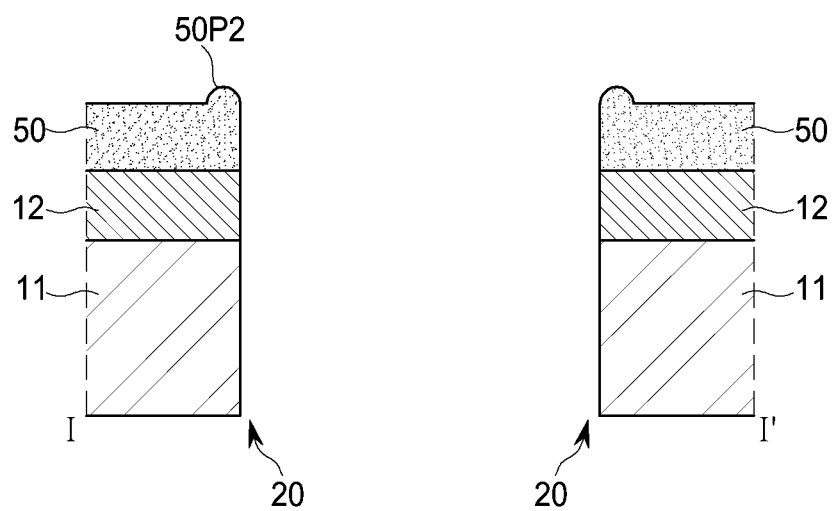
Figure 8B:
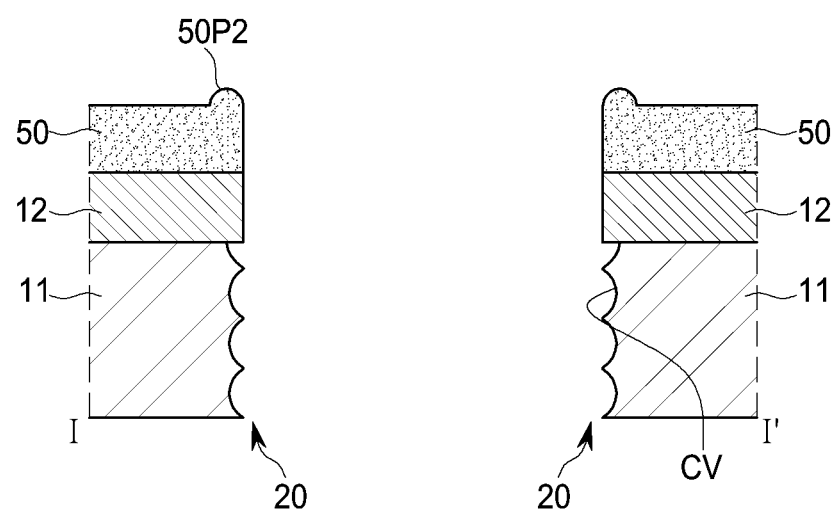
Figure 9A:
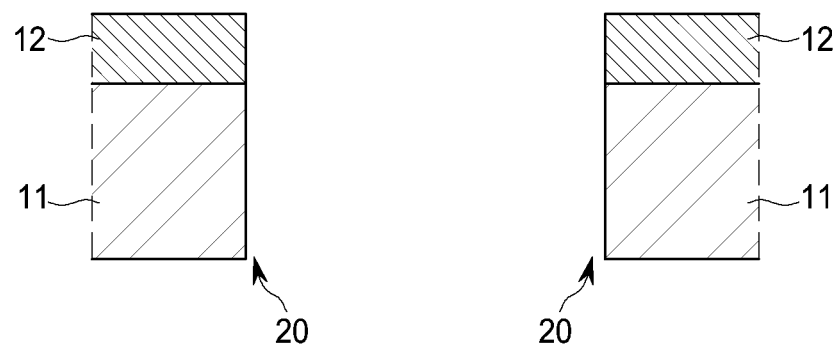
Figure 9B:
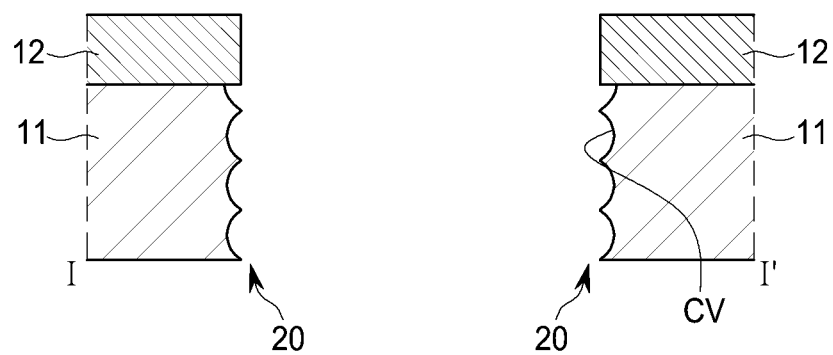
Figure 10:
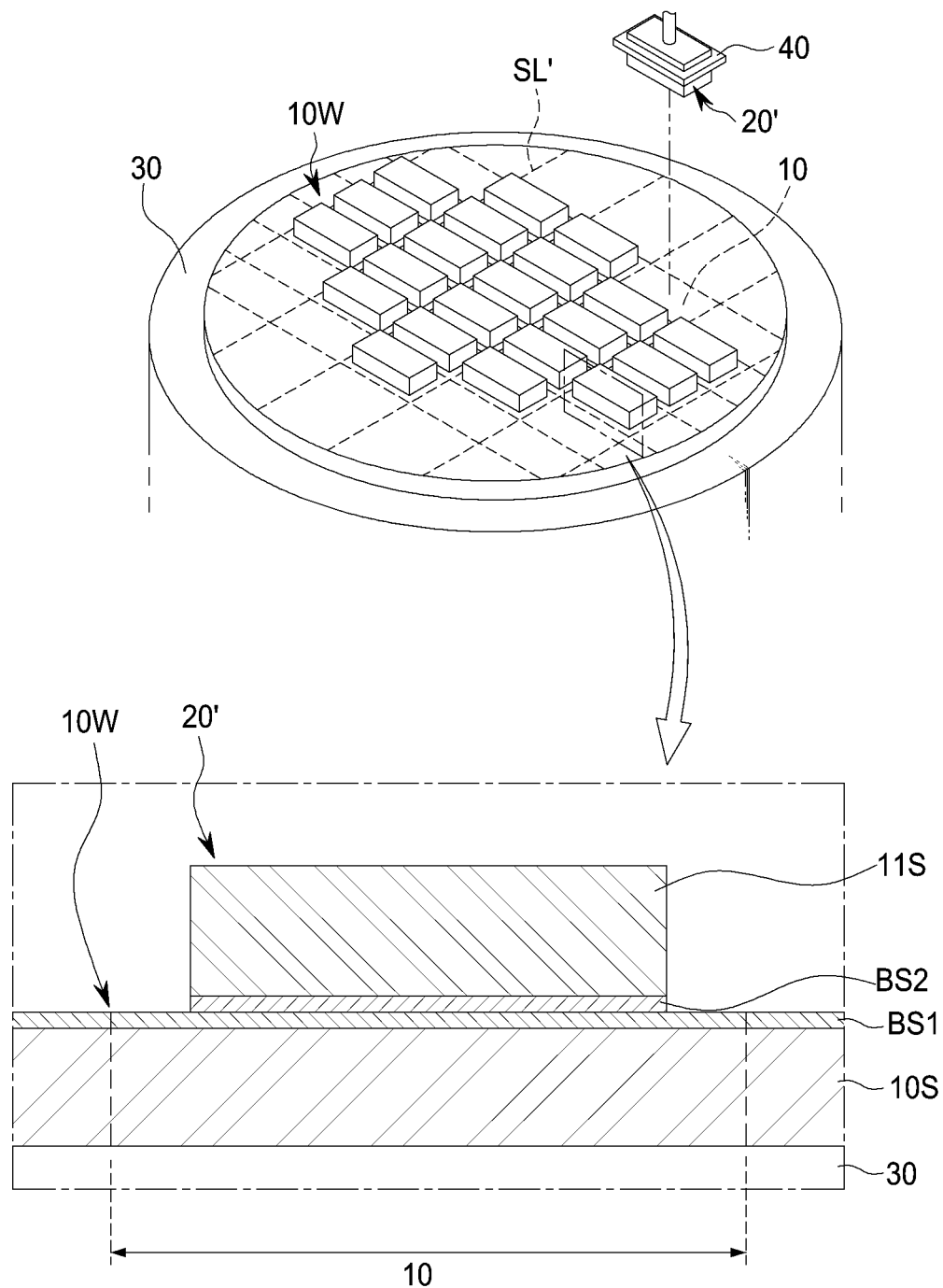
FIG. 10 illustrates a process of bonding the semiconductor chips manufactured with reference to FIGS. 4A to 9B on a wafer.

FIG. 10 illustrates a process of bonding the semiconductor chips manufactured with reference to FIGS. 4A to 9B on a wafer.

Referring to FIGS. 4A and 4B, a wafer WF including a plurality of chip regions CH and a plurality of scribe lane regions SL between the plurality of chip regions CH may be prepared. The wafer WF may be a wafer before dicing is performed. The plurality of scribe lane regions SL may include one region through which the dicing line DL passes. Here, the dicing line DL may be a virtual line. A dicing process to be described later may cut the wafer WF along the dicing line DL.

Figure 5:
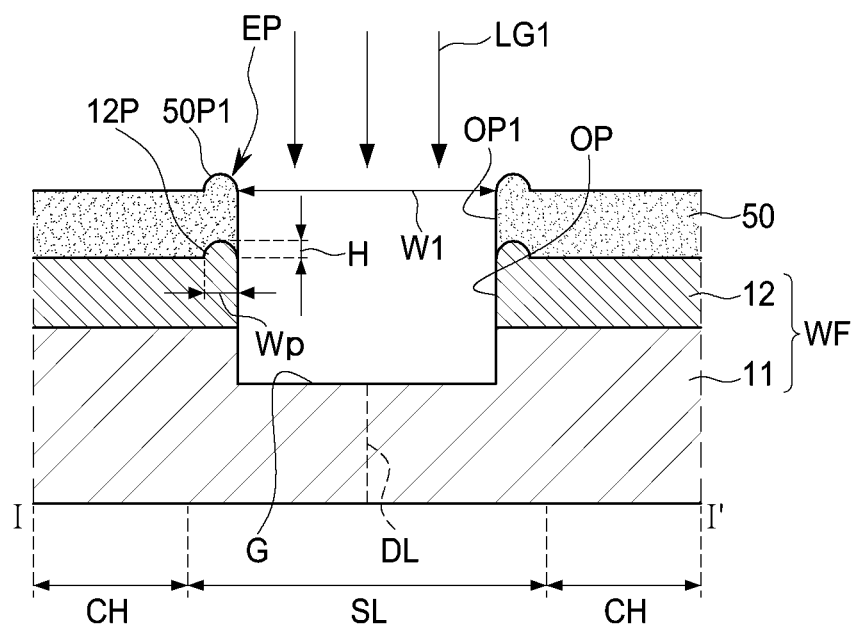
FIGS. 5, 6, 7A, 7B, 8A, 8B, 9A and 9B illustrate cross-sectional views sequentially showing manufacturing processes explanatory of a method of manufacturing a semiconductor package according to embodiments of the inventive concepts.

Referring to FIGS. 3 and 5, a mask layer 50 may be formed on a wafer WF including a semiconductor substrate 11 and an insulating layer 12 (S10), and a groove G may be formed in the semiconductor substrate 11 by performing a first laser grooving process LG1 (S20).

The wafer WF may include a semiconductor substrate 11 and an insulating layer 12. The semiconductor substrate 11 may include a semiconductor element such as silicon and germanium, or a compound semiconductor such as for example silicon carbide (SiC), gallium arsenide (GaAs), indium arsenide (InAs), and indium phosphide (InP). The sefsticonductor substrate 11 is not limited to the above noted materials.

A device layer may be formed between the semiconductor substrate 11 and the insulating layer 12, and the device layer (not shown) may include transistors constituting an integrated circuit. The transistors constituting the integrated circuit may for example include planar Metal Oxide Semiconductor FETs (MOSFETs), FinFETs in which an active region has a fin structure, and/or Multi-Bridge Channel FETs (MBCFETs™) or Gate-All-Around transistors including a plurality of channels vertically stacked on the active region, or vertical FETs (VFETs), but are not limited thereto. The integrated circuit may for example include a volatile memory device such as DRAM, static RAM (SRAM), and the like, and a non-volatile memory device such as PRAM, MRAM, ReRAM, a flash memory device, and the like.

An interconnection structure (not shown) electrically connected to the integrated circuit of the device layer may be formed in the insulating layer 12. In a scribe lane region SL, an align-key provided for aligning a photomask during a photolithography process may be provided in the semiconductor substrate 11 or the insulating layer 12. The insulating layer 12 may for example be formed of at least one of silicon oxide (SiO), silicon nitride (SiN), silicon oxynitride (SiON), silicon oxycarbide (SiOC), and silicon carbonitride (SiCN).

The mask layer 50 may be formed on a front surface of the wafer WF. The mask layer 50 may be formed of a photosensitive material such as photo resist or a non-photosensitive material such as protection layer coating (PLC).

A first laser grooving process LG1 may be a process for forming a groove G in a surface of the semiconductor substrate 11 to perform a subsequent dicing process. The first laser grooving process LG1 may be performed along a plurality of scribe lane regions SL, and accordingly, trench-shaped grooves G may be formed in the semiconductor substrate 11. An opening OP may be formed in the insulating layer 12 and a first opening OP1 having a first width W1 may be formed in the mask layer 50 by the first laser grooving process LG1.

Burrs 12P protruding upwardly may be formed on the insulating layer 12 adjacent to the groove G by the first laser grooving process LG1. The burrs 12P may extend from a side surface exposed through an opening OP of the insulating layer 12 to have a shape convexly protruding upwardly. The burrs 12P formed on the insulating layer 12 may deteriorate surface characteristics of individual semiconductor chips after dicing, and in particular, in a process of bonding the first structure 1 and the second structure 2 as shown in FIG. 2, the burrs 12P may provide an uneven bonding surface that deteriorate bonding properties, such that the burrs 12P of the insulating layer 12 may need to be removed. The burrs 12P of the insulating layer 12 may include an insulating material or a metal material. The burrs 12P of the insulating layer 12 may have a height H of about 2 μm or less and a maximum width Wp of about 10 μm or less. A first mask burr 50P1 may also be formed on the mask layer 50 by the first laser grooving process LG1.

Figure 6:
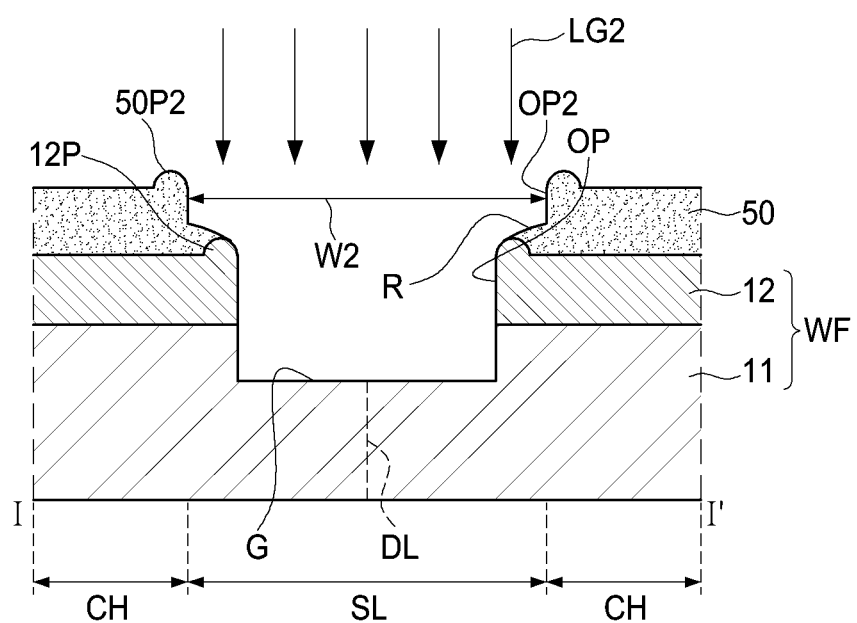

Referring to FIGS. 3 and 6, a second opening OP2 may be formed by expanding the first opening OP1 of the mask layer 50 by performing a second laser grooving process LG2 (S30).

A second laser grooving process LG2 may be a preceding process to remove the burrs 12P of the insulating layer 12. The second laser grooving process LG2 may be performed on a region larger than that of the first laser grooving process LG1. For example, in the second laser grooving process LG2, a second opening OP2 having a second width W2, wider than the first width W1 of the first opening OP1 may be formed in the mask layer 50. In some embodiments, the second width W2 may correspond to a width of the scribe lane SL. An edge portion EP including a first mask burr 50P1 of the mask layer 50 exposed to an upper portion of the groove G of the semiconductor substrate 11 as shown in FIG. 5 may be removed by the second laser grooving process LG2. However, as shown in FIG. 6, a portion of the edge portion EP of the mask layer 50 may remain to cover the burrs 12P of the insulating layer 12. That is, when the second laser grooving process LG2 is performed, residue R of the mask layer 50 may remain on the burrs 12P of the insulating layer 12. Meanwhile, second mask burrs 50P2 may be further formed around the second opening OP2 of the mask layer 50.

The second laser grooving process LG2 may be performed with a focusing depth higher than a focusing height of the first laser grooving process LG1. For example, in the first laser grooving process LG1 a laser beam may be irradiated at a first level to be focused on the semiconductor substrate 11, and in the second laser grooving process LG2 a laser beam may be irradiated at a second level higher than the first level to be focused on the mask layer 50.

The first laser grooving process LG1 may be a process of irradiating a laser beam having a higher frequency and greater average output of power than the second laser grooving process LG2. The first laser grooving process LG1 may be a process of irradiating a laser beam having a scan speed slower than the second laser grooving process LG2 and a higher number of scan repetitions.

Figure 7A:
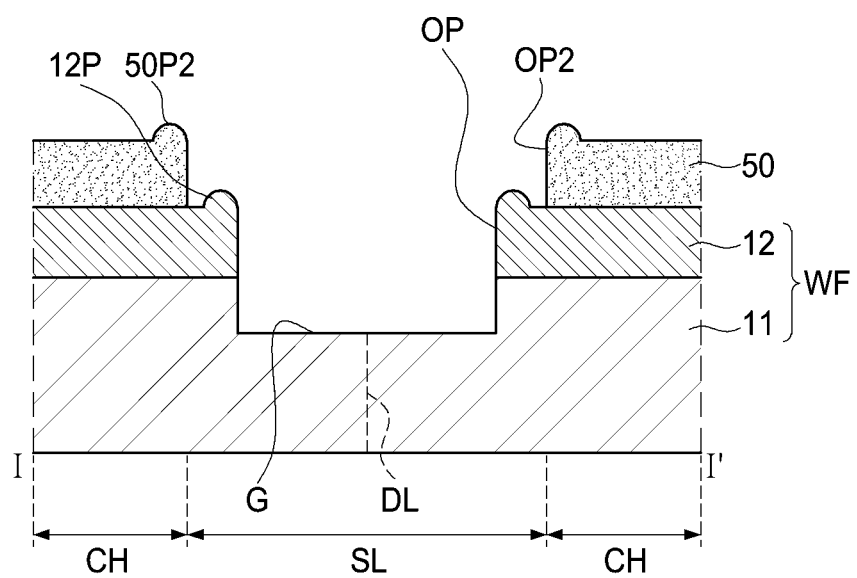

Referring to FIGS. 3 and 7A, a portion of the mask layer 50, which is a residue R, may be removed to expose the burrs 12P of the insulating layer 12 (S40).

Exposing the burrs 12P of the insulating layer 12 by removing a portion of the mask layer 50, which is a residue R, may include, for example, performing a descumming process. The descumming process may be a process of removing the residue R of the mask layer 50 covering the burrs 12P of the insulating layer 12 using a plasma gas. The plasma gas may be a plasma gas including at least one of $O_2$, $N_2$, Ar, and $C_xF_y$, but is not limited thereto. By the descumming process, the burrs 12P of the insulating layer 12 may be exposed to (e.g., exposed from) a side surface of the mask layer 50.

Figure 7B:
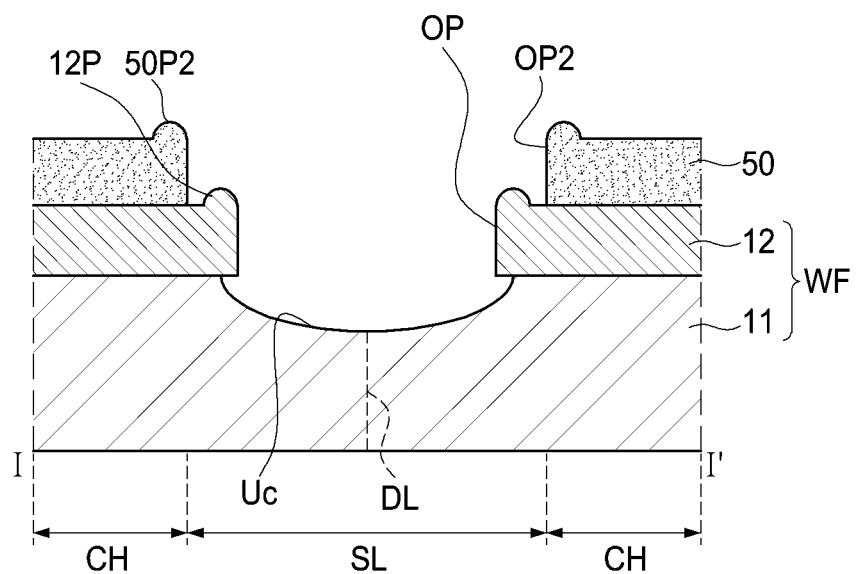

Referring to FIG. 7B, an undercut Uc may be formed in the semiconductor substrate 11, while the burrs 12P of the insulating layer 12 are being exposed during the descumming process. The undercut Uc may expose a portion of a lower surface of the insulating layer 12, and may have a form in which a width thereof decreases toward a lower portion.

Referring to FIGS. 3 and 8A, semiconductor substrate 11 may be cut while removing burrs 12P of the insulating layer 12 by performing a dicing process (S50).

By cutting the semiconductor substrate 11 by the dicing process, a wafer WF may be divided into individual semiconductor chips 20. Accordingly, a plurality of semiconductor chips 20 may be formed. In the dicing process, a plasma etching process may be performed using the mask layer 50 as an etching mask. Accordingly, the cut formed during the dicing process may have a width corresponding to the second width W2 (i.e., a width of the scribe lane). During the dicing process, the burrs 12P of the insulating layer 12 exposed from the mask layer 50 may be removed.

Referring to FIG. 8B, when the semiconductor substrate 11 is cut by a plasma etching process, surface irregularities CV in a form of undercuts or embossing may be formed on a cut surface of the semiconductor substrate 11. Due to the surface unevenness (CV) of the semiconductor substrate 11, the semiconductor substrate 11 may include a pointed protrusion and a concave recess portion.

Referring to FIGS. 3, 9A, and 9B, a mask layer 50 may be removed (S60).

After the semiconductor substrate 11 is cut by the dicing process, the mask layer 50 may be removed by, for example, a strip process. Since the burrs 12P are removed from the insulating layer 12 by the dicing process, when the mask layer 50 is removed, an upper surface of the insulating layer 12 may be substantially flat. Accordingly, after the individual semiconductor chips 20 are divided from the wafer WF, the upper surface of each insulating layer 12 providing a portion of the bonding surface may be substantially flat without irregularities. FIG. 9B shows a case in which surface irregularities CV were formed when the semiconductor substrate 11 was cut by a plasma etching process (see FIG. 8B). FIG. 9A in contrast shows a case in which surface irregularities CV were not formed when the semiconductor substrate 11 was cut by a plasma etching process (see FIG. 8A).

FIG. 10 exemplarily illustrates a die-to-wafer bonding process. Referring to FIG. 10, a semiconductor chip 20' may be pre-bonded on a wafer structure 10W in which a plurality of semiconductor structures 10 are formed on an electrostatic chuck 30 using a pick-and-place device 40. The wafer structure 10W may include semiconductor structures 10 separated by scribe lanes SL'. The semiconductor structures 10 may include a first substrate structure 10S and a first bonding structure BS1 on the first substrate structure 10S. The semiconductor chip 20' may include a bonding pad (not shown), and may be directly disposed on the semiconductor structures 10. Here, "pre-bonding" may be understood as placing the semiconductor chip 20' on the corresponding semiconductor structure 10 without applying pressure or heat. Thereafter, the semiconductor chip 20' and the semiconductor structure 10 may be coupled to each other by performing dielectric-dielectric bonding and copper-copper bonding. As illustrated in the enlarged cross-sectional view of FIG. 10, the semiconductor chip 20' may include a second bonding structure BS2 including the insulating layer 12 in a state in which the burrs 12P are removed as described with reference to FIGS. 4A to 9 and a second substrate structure 11S on the second bonding structure BS2. Accordingly, the second bonding structure BS2 of the semiconductor chip 20' may provide a substantially flat surface without irregularities, thereby improving bonding characteristics with the semiconductor structure 10.

Figure 11:
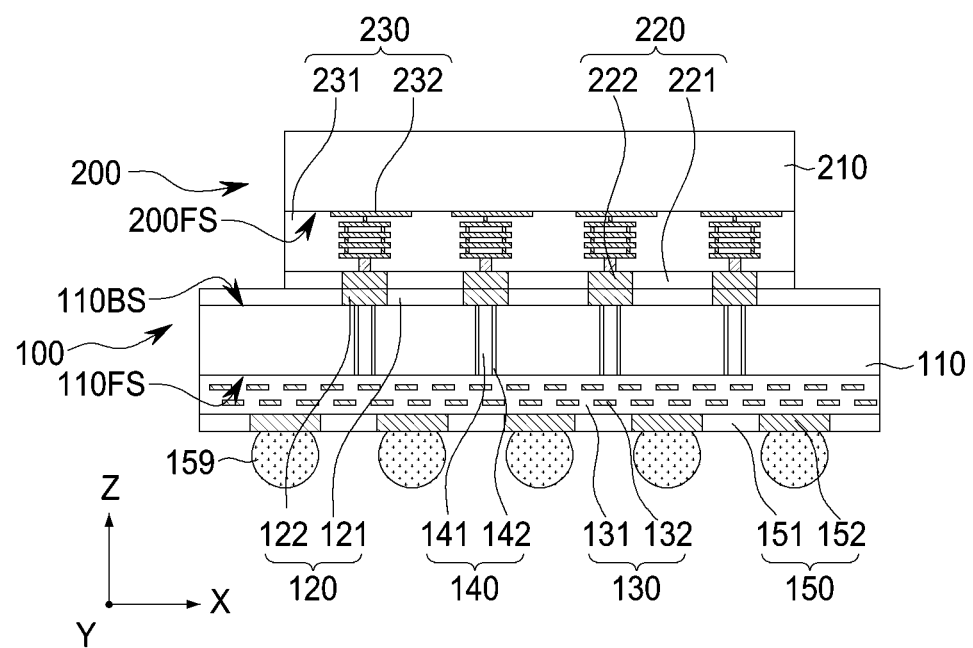
FIG. 11 illustrates a cross-sectional view of a semiconductor package according to embodiments of the inventive concepts.

FIG. 11 illustrates a cross-sectional view of a semiconductor package according to embodiments of the inventive concepts.

Referring to FIG. 11, a semiconductor package 1000 according to embodiments of the inventive concepts may include a semiconductor structure 100 and a semiconductor chip 200 stacked in a vertical direction (Z-axis direction). The semiconductor structure 100 and the semiconductor chip 200 may have a structure in which elements exposed to an upper surface of the semiconductor structure 100 and a lower surface of the semiconductor chip 200 are directly bonded (e.g., which may be referred to as hybrid bonding, direct bonding, or the like), without a separate connection member (e.g., a metal pillar, a solder bump, or the like). For example, dielectric-to-dielectric bonding and copper (Cu)-copper (Cu) bonding may be formed on an interface between the semiconductor structure 100 and the semiconductor chip 200. The first bonding structure 120 of the semiconductor structure 100 and the second bonding structure 220 of the semiconductor chip 200 may be bonded to each other by bonding.

The semiconductor structure 100 is a semiconductor wafer-based structure, and may include a semiconductor layer 110, a back cover layer 120, which is a 'first bonding structure', a circuit layer 130, a through via 140, and a front cover layer 150. For example, the semiconductor structure 100 may be a silicon interposer substrate, a semiconductor chip, or the like. When the semiconductor structure 100 is a semiconductor chip, the semiconductor structure 100 and the semiconductor chip 200 stacked thereon may be chiplets constituting a multi-chip module (MCM), but an example embodiment thereof is not limited thereto. This will be described later with reference to FIG. 12.

The semiconductor layer 110 may include a semiconductor element such as silicon, germanium, or a compound semiconductor such as for example silicon carbide (SiC), gallium arsenide (GaAs), indium arsenide (InAs), and indium phosphide (InP). The semiconductor layer 110 is a portion of the semiconductor wafer, and may be provided as an individual semiconductor layer 110 by cutting the semiconductor wafer.

The circuit layer 130 may be disposed on a front surface 110FS of the semiconductor layer 110, and may include an interlayer insulating layer 131 and an internal wiring 132. The interlayer insulating layer 131 may include at least one of silicon oxide, silicon nitride, and silicon oxynitride. The internal wiring 132 may redistribute a back pad 122 or a through via 140 disposed on a back surface 110BS, and may be formed in a multilayer structure including a plurality of wiring lines and a plurality of wiring vias. The wiring line and wiring via may include, for example, aluminum (Al), gold (Au), cobalt (Co), copper (Cu), nickel (Ni), lead (Pb), tantalum (Ta), and tellurium (Te), titanium (Ti), tungsten (W), or a metal material including a combination thereof. A barrier film (not shown) including titanium (Ti), titanium nitride (TiN), tantalum (Ta), or tantalum nitride (TaN) may be disposed between the wiring line and/or the wiring via and the interlayer insulating layer 131.

The back cover layer 120 may be disposed on a back surface 110BS of the semiconductor layer 110, and may include a back insulating layer 121, which is a 'first bonding insulating layer' and a back pad 122, which is a 'first bonding pad'. The back insulating layer 121 and the front insulating layer 151 may include at least one of silicon oxide, silicon nitride, silicon oxynitride, silicon carbide, silicon oxycarbide, and silicon carbonitride. The back pad 122 and the front pad 152 may include the above-described metal material similarly to an internal wiring 132, but do not necessarily include the same type of metal material as the internal wiring 132. The back insulating layer 121 may include an insulating material that may be bonded to the second bonding insulating layer 221 of the semiconductor chip 200, for example, at least one of silicon oxide, silicon nitride, silicon oxynitride, silicon carbide, silicon oxycarbide, and silicon carbonitride. In a similar view, the back pad 122 may be formed of a conductive material that may be bonded to the second bonding pad 222 of the semiconductor chip 200, and may include, for example, any one of copper (Cu), nickel (Ni), gold (Au), and silver (Ag), or an alloy thereof. The back surface 110BS of the semiconductor layer 110 may be covered by a dielectric film (e.g., an ONO layer) (not shown). The dielectric film may electrically insulate the back pad 122 from the semiconductor material constituting the semiconductor layer 110.

According to an example embodiment, the circuit layer 130 may be disposed on the front surface 110FS of the semiconductor layer 110 and may include individual elements (not shown) constituting an integrated circuit. In this case, an internal wiring 132 may be electrically connected to the individual elements or devices (not shown). The individual devices may include various active and/or passive devices such as for example FETs such as planar FETs, FinFETs, or the like, flash memory, memory devices such as DRAM, SRAM, EEPROM, PRAM, MRAM, FeRAM, RRAM, and the like, logic devices such as AND, OR, NOT, and the like, and/or systems such as LSI, CIS, or MEMS.

The front cover layer 150 may be disposed below the circuit layer 130. The front cover layer 150 may include a front insulating layer 151 and a front pad 152. The front pad 152 may be electrically connected to the back pad 122 through the internal wiring 132 and the through via 140. The front pad 152 may provide a connection terminal through which the semiconductor structure 100 and the semiconductor chip 200 may be electrically connected to an external device. A separate connection member 159 (e.g., a solder ball, a copper pillar, or the like) may be disposed below the front pad 152, but example embodiments of the inventive concepts are not limited thereto, and the semiconductor structure 100 may be hybrid-bonded to another structure (e.g., a silicon interposer) without a connection member such as a solder ball, or the like.

The through via 140 may pass through the semiconductor layer 110 to be electrically connected to the internal wiring 132. The through via 140 may be disposed to partially extend into the back insulating layer 121 and the interlayer insulating layer 131 of the circuit layer 130. According to an example embodiment, the through via 140 may electrically connect individual devices (not shown) and the internal wiring 132 disposed on the front surface 110FS of the semiconductor layer 110 through the internal wiring 132 of the circuit layer 130. The through via 140 may include a through electrode 141 and a barrier film 142 surrounding a side surface of the through electrode 141. The through electrode 141 may include, for example, tungsten (W), titanium (Ti), aluminum (Al), or copper (Cu). The barrier film 142 may for example include a metal compound such as tungsten nitride (WN), titanium nitride (TiN), or tantalum nitride (TaN). A via insulating film (not shown) may be formed on a side surface of the through via 140. The via insulating film may be a single film or a multilayer film. The via insulating film may include silicon oxide, silicon oxynitride, silicon nitride, a polymer, or a combination thereof.

The semiconductor chip 200 may be stacked on the semiconductor structure 100, and may include a semiconductor layer 210, a circuit layer 230, and a second bonding structure 220. In the drawings, one semiconductor chip 200 is illustrated, but the number of semiconductor chips 200 is not limited to one. For example, in other embodiments of the inventive concepts two or more semiconductor chips may be stacked on the semiconductor structure 100 in a vertical direction (Z-axis direction), or arranged in a horizontal direction (X-axis and Y-axis directions). Since the semiconductor layer 210 and the circuit layer 230 have similar characteristics to the semiconductor layer 110 and the circuit layer 130 of the semiconductor structure 100, overlapping descriptions thereof will be omitted.

In the inventive concepts, since an edge portion of the second bonding structure 220 of the semiconductor chip 200 is cut through the manufacturing process of FIGS. 4A to 9, burrs formed on the second bonding structure 220 of the semiconductor chip 200 may be removed, and the second bonding structure 220 may include a flat bonding surface without irregularities. Accordingly, the second bonding structure 220 can be stably bonded to the first bonding structure 120 without a void or an empty space therebetween, and bonding surface characteristics can be improved and electrical characteristics and reliability of the semiconductor package can be improved. In addition, since the burrs formed on the second bonding structure 220 are removed by performing a plasma etching process, surface irregularities may be formed on the cut surface of the semiconductor layer 210 as shown in FIG. 7B or FIG. 8B.

Figure 12:
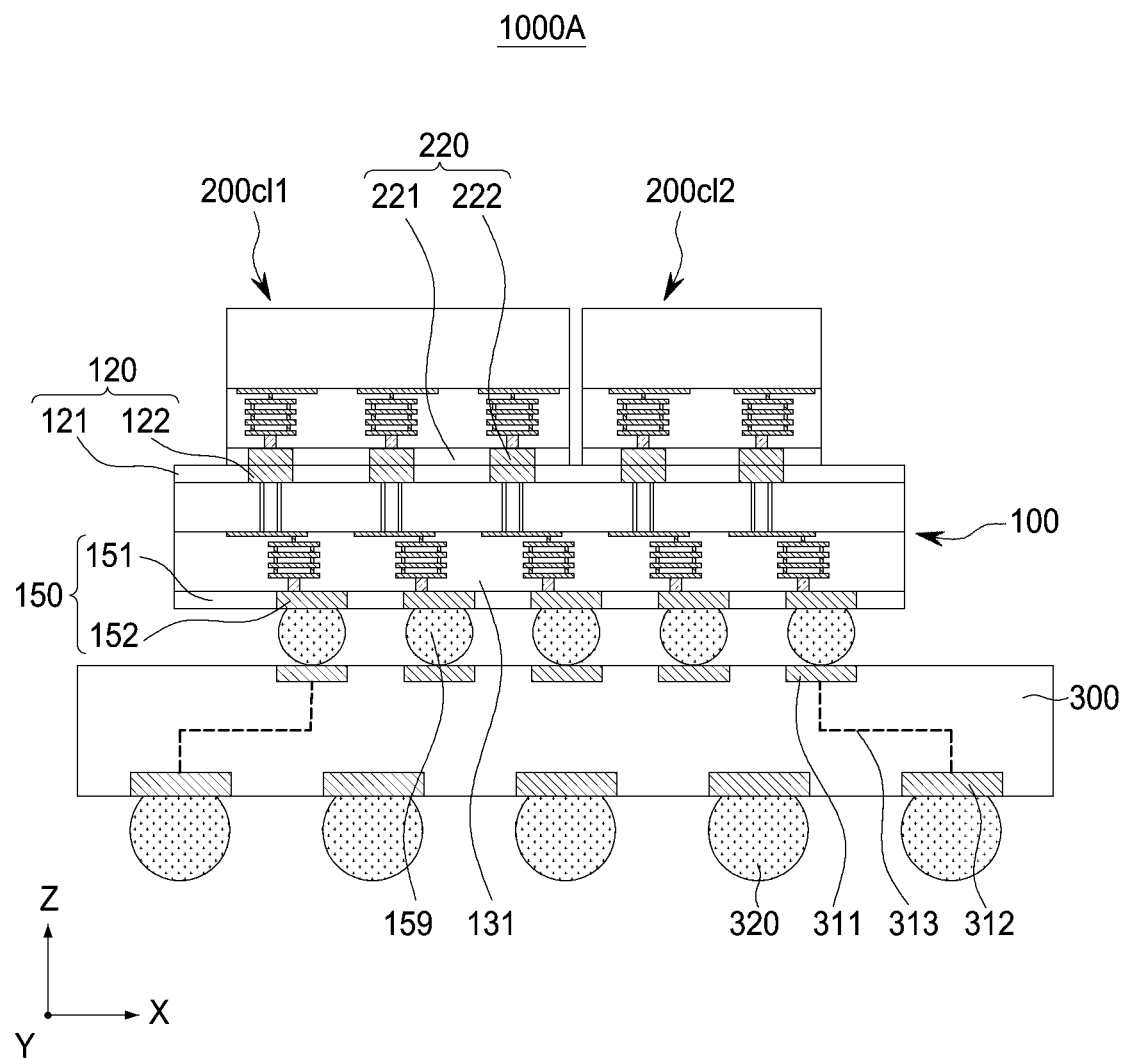
FIG. 12 illustrates a cross-sectional view of a semiconductor package according to embodiments of the inventive concepts.

FIG. 12 illustrates a cross-sectional view of a semiconductor package according to embodiments of the inventive concepts. Detailed description of features of the semiconductor package 1000A in FIG. 12 that are the same or similar to those in semiconductor package 1000 in FIG. 11 may be omitted from the following for the sake of brevity.

Referring to FIG. 12, a semiconductor package 1000A according to embodiments of the inventive concepts may have the same or similar characteristics as those described with reference to FIG. 11, except that a semiconductor chip 200 is provided as chiplets 200c11 and 200c12 disposed side by side on the semiconductor structure 100. According to an example embodiment, the semiconductor structure 100 and the semiconductor chip 200 may be mounted on a package substrate 300.

The chiplets 200c11 and 200c12 may together constitute a multi-chip module (MCM). The MCM can be composed of an I/O, a CPU, a GPU, an FPGA chip, or the like. The number of chiplets stacked on the semiconductor structure 100 is not particularly limited, and for example, two or less or four or more chiplets may be mounted on the semiconductor structure 100. Here, the chiplet or chiplet technology may refer to a semiconductor chip manufactured by being differentiated according to the size and function of a device, or a manufacturing technology for such a semiconductor chip.

The semiconductor structure 100 may be, for example, an active interposer performing a function of an I/O chip. The semiconductor structure 100 may include an I/O device, a DC/DC converter, a sensor, a test circuit, and the like therein. Accordingly, the chiplets 200c11 and 200c12 and the semiconductor structure 100 may constitute the MCM.

In the drawing, the semiconductor structure 100 is mounted on the package substrate 300 through a connection member 159, but depending on the type of the package substrate 300 (e.g., a silicon substrate), a front cover layer 150 may form a hybrid bonding with the package substrate 300. In this case, since an edge portion of the front cover layer 150 is cut through the manufacturing process of FIGS. 4A to 9, burrs formed on the front insulating layer 151 of the front cover layer 150 can be removed, and the front cover layer 150 may include a flat bonding surface without unevenness.

For example, the package substrate 300 may include a lower pad 312 disposed on a lower surface of the body, an upper pad 311 disposed on an upper surface of the body, and a redistribution circuit 313 electrically connecting the lower pad 312 and the upper pad 311. The package substrate 300 may be a substrate for a semiconductor package including a printed circuit board (PCB), a ceramic substrate, a glass substrate, a tape wiring board, and the like. A body of the package substrate 300 may include different materials depending on the type of the substrate. For example, when the package substrate 300 is a printed circuit board, it may have a form in which a wiring layer is additionally laminated on one or both sides of a body copper clad laminate or a copper clad laminate. A solder resist layer may be respectively formed on a lower surface and an upper surface of the package substrate 300. The upper and lower pads 311 and 312 and the redistribution circuit 313 may form an electrical path connecting the lower surface and the upper surface of the package substrate 300. An external connection terminal 320 connected to the lower pad 312 may be disposed below the package substrate 300. The external connection terminal 320 may be made of a conductive material having a shape such as a ball or a pin, or the like.

Figure 13:
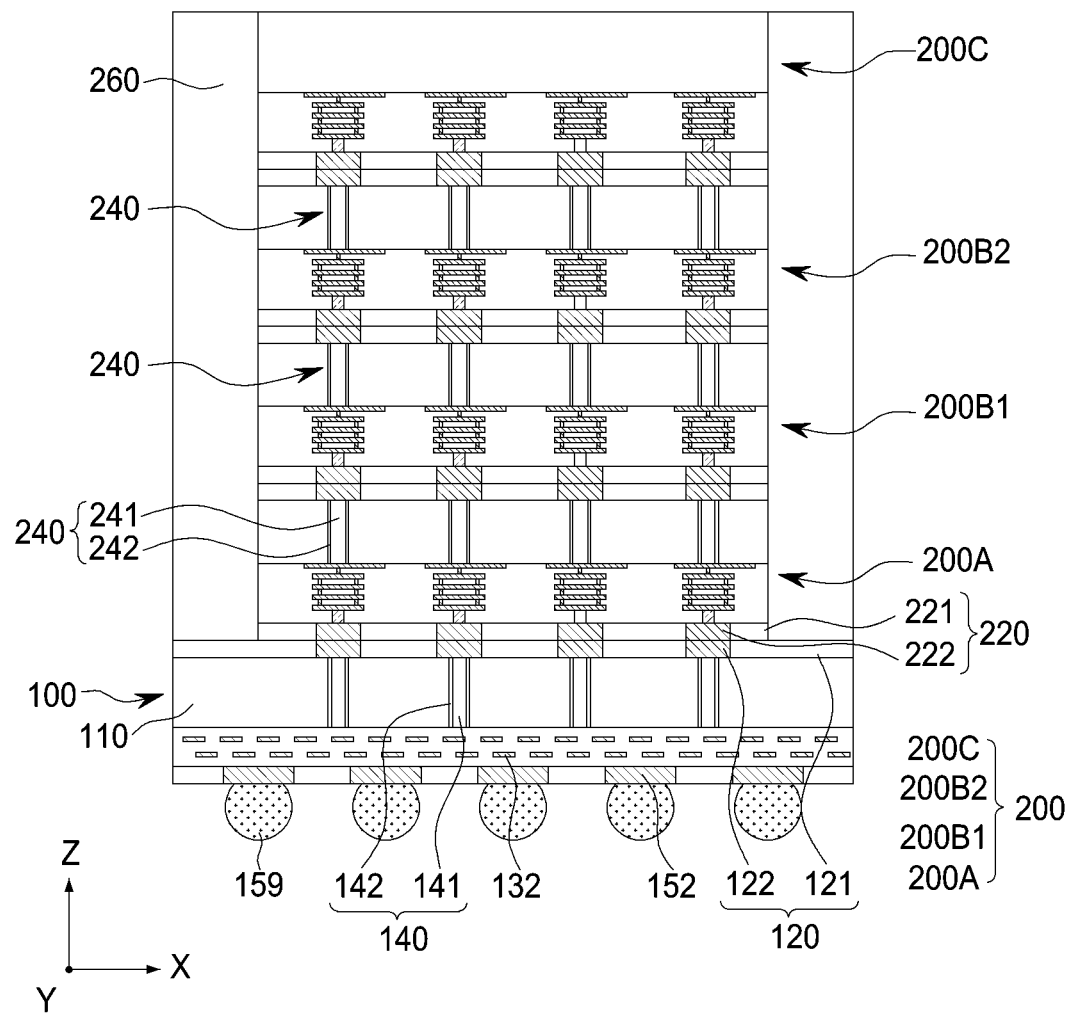
FIG. 13 illustrates a cross-sectional view of a semiconductor package according to embodiments of the inventive concepts.

FIG. 13 illustrates a cross-sectional view of a semiconductor package according to embodiments of the inventive concepts. Detailed description of features of the semiconductor package 1000B in FIG. 13 that are the same or similar to those in semiconductor package 1000 in FIG. 11 may be omitted from the following for the sake of brevity.

Referring to FIG. 13, a semiconductor package 1000B according to embodiments of the inventive concepts may have the same or similar characteristics as those described with reference to FIG. 11, except that the semiconductor chip 200 in FIG. 13 is provided with a plurality of semiconductor chips 200A, 200B1, 200B2, and 200C. The semiconductor package 1000B may further include an encapsulant 260 covering the plurality of semiconductor chips 200A, 200B1, 200B2, and 200C on the semiconductor structure 100. The encapsulant 260 may expose an upper surface of the third semiconductor chip 200C, but may also cover the upper surface of the third semiconductor chip 200C according to other embodiments. The encapsulant 260 may include, for example, an epoxy mold compound (EMC), but a material of the encapsulant 260 is not particularly limited thereto. The number of the plurality of semiconductor chips 200A, 200B1, 200B2, and 200C is not limited to that illustrated in the drawings, and may be two, three, or five or more.

The plurality of semiconductor chips 200A, 200B1, 200B2, and 200C may include a first semiconductor chip 200A attached to an upper surface of the semiconductor structure 100, one or more second semiconductors chips 200B1 and 200B2 sequentially stacked on the first semiconductor chip 200A, and a third semiconductor chip 200C stacked on the second semiconductors chips 200B1 and 200B2. Each of the first to third semiconductor chips 200A, 200B1, 200B2, and 200C may include the same structure as the second bonding structure 220 described with respect to FIG. 11, and a hybrid bonding structure may be formed between the first semiconductor chip 200A and the semiconductor structure 100, and between the second semiconductor chips 200B1 and 200B2 and the third semiconductor chip 200C. Since the second bonding structure 220 is formed through the manufacturing process of FIGS. 4A to 9, burrs may be removed, such that the second bonding structure 220 may include a flat bonding surface without irregularities. The first semiconductor chip 200A and the second semiconductor chips 200B1 and 200B2 may further include a second through via 240. The second through via 240 may include a through electrode 241 and a barrier film 242. Since the through electrode 241 and the barrier film 242 of the second through via 240 have similar characteristics to the through electrode 141 and the barrier film 142 of FIG. 11, overlapping descriptions thereof will be omitted.

For example, the semiconductor structure 100 may be a buffer chip including a plurality of logic elements and/or memory elements. Accordingly, the semiconductor structure 100 may transmit signals from the plurality of semiconductor chips 200A, 200B1, 200B2, and 200C stacked thereon externally, and also transmit signals and power from the outside to the plurality of semiconductor chips 200A, 200B1, 200B2, and 200C. The semiconductor structure 100 may perform both a logic function and a memory function through logic devices and memory devices. However, according to an example embodiment, only the logic function may be performed by including only the logic devices. The plurality of semiconductor chips 200A, 200B1, 200B2, and 200C may include, for example, volatile memory chips such as DRAM and SRAM, or non-volatile memory chips such as PRAM, MRAM, FeRAM, or RRAM. For example, the semiconductor package 1000B of example embodiments may be used in a high bandwidth memory (HBM) product, an electro data processing (EDP) product, or the like.

Figure 14:
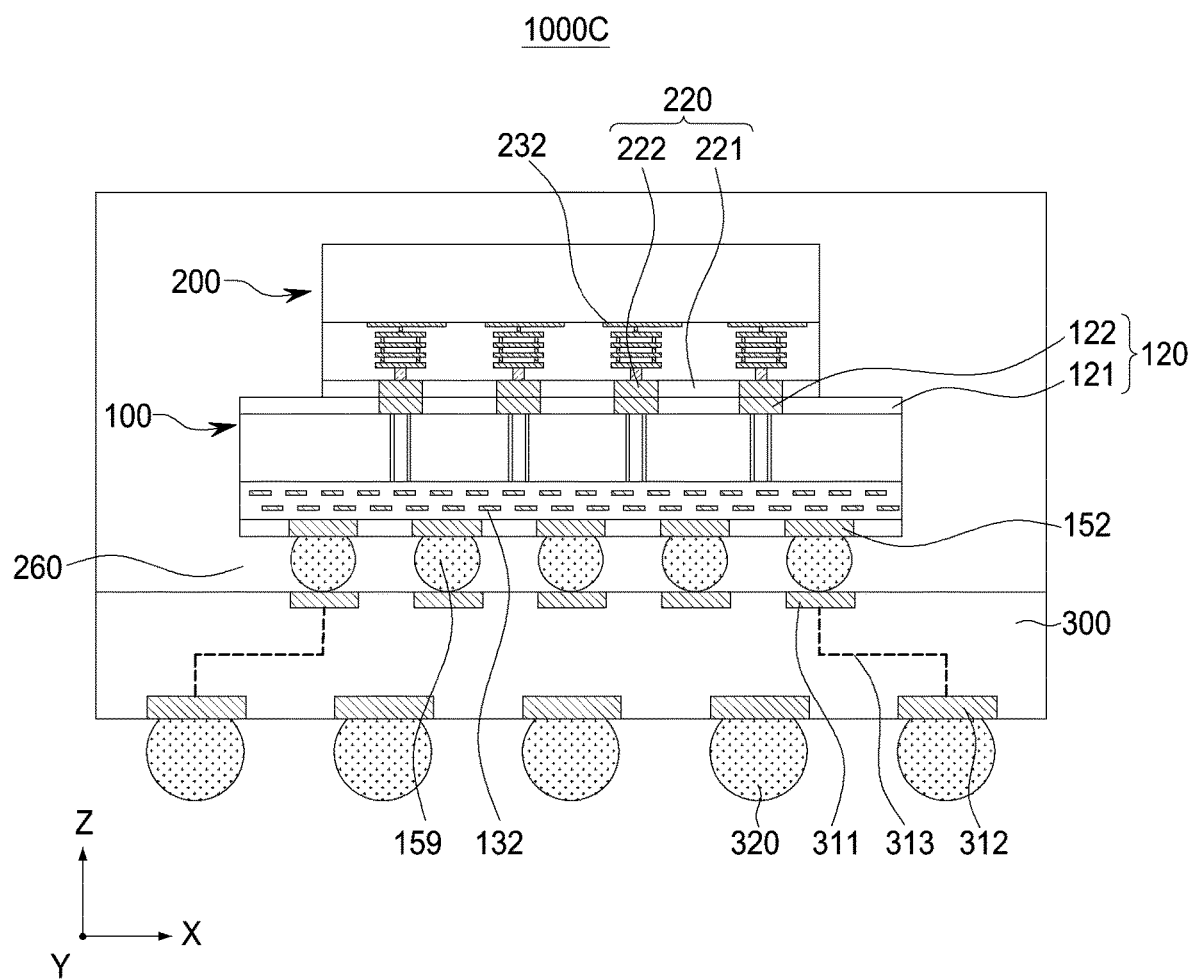
FIG. 14 illustrates a cross-sectional view of a semiconductor package according to embodiments of the inventive concepts.

FIG. 14 illustrates a cross-sectional view of a semiconductor package according to example embodiments of the inventive concepts. Detailed description of features of the semiconductor package 1000C in FIG. 14 that are the same or similar to those in semiconductor package 1000 in FIG. 11 may be omitted from the following for the sake of brevity.

Referring to FIG. 14, a semiconductor package 1000C according to embodiments of the inventive concepts may have the same or similar characteristics as those described with reference to FIG. 11, except that the semiconductor package 1000C further includes a package substrate 300 on which the semiconductor structure 100 is mounted, and an encapsulant 260 for encapsulating the semiconductor structure 100 and the semiconductor chip 200 on the package substrate 300.

In one example, the semiconductor structure 100 may include, for example, a central processor (CPU), a graphics processor (GPU), a field programmable gate array (FPGA), an application processor (AP), a digital signal processor (DSP), a cryptographic processor, a microprocessor, a microcontroller, an analog-to-digital converter, an application specific integrated circuit (ASIC), or the like. Also, the semiconductor chip 200 may include a memory chip such as DRAM, SRAM, PRAM, MRAM, FeRAM, or RRAM. In the present example embodiment, the semiconductor chip 200 is illustrated as in FIG. 11, but may have a shape similar to that described with reference to FIGS. 12 to 14. For example, the semiconductor chip 200 may include a Power Management IC (PMIC) chip.

As set forth above, according to the inventive concepts, by removing burrs formed on an insulating layer when a laser grooving process is performed in a dicing process, a substantially flat bonding surface may be provided to a semiconductor chip. That is, the semiconductor chip may be provided with a flat bonding surface. Accordingly, since bonding properties between bonding structures are improved, a semiconductor package having improved electrical properties and reliability, and a method for manufacturing the same may be provided.

As described herein, a lower side, a lower portion, a lower surface, and the like, are used to refer to a direction toward a mounting surface of a fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection.

Example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it should be apparent to those skilled in the art that modifications and variations may be made without departing from the scope of the inventive concepts as defined by the appended claims.

What is claimed is:

1. A method of manufacturing a semiconductor package, comprising:
forming a mask layer on a wafer, the wafer including a semiconductor substrate and an insulating layer;
forming a groove in the semiconductor substrate by performing a first laser grooving process;
expanding an opening of the mask layer opened by the first laser grooving process by performing a second laser grooving process;
exposing a portion of the insulating layer by removing a portion of the mask layer; and
cutting the semiconductor substrate while removing the portion of the insulating layer exposed during the exposing by performing a dicing process.

2. The method of manufacturing a semiconductor package of claim 1, wherein, when the first laser grooving process is performed, burrs protruding upwardly from the insulating layer are formed,
wherein the burrs of the insulating layer are exposed from a side surface of the mask layer, and are removed by the dicing process.

3. The method of manufacturing a semiconductor package of claim 1, wherein, when the first laser grooving process is performed, a first opening having a first width is formed in the mask layer, and
when the second laser grooving process is performed, a second opening having a second width, greater than the first width, is formed in the mask layer.

4. The method of manufacturing a semiconductor package of claim 1, wherein an edge portion of the mask layer exposed in an upper portion of the groove is removed by the second laser grooving process.

5. The method of manufacturing a semiconductor package of claim 1, wherein residue of the mask layer remains on the portion of the insulating layer in the expanded opening formed by the second laser grooving process, and
the residue of the mask layer is removed using plasma gas during the exposing.

6. The method of manufacturing a semiconductor package of claim 1, further comprising removing the mask layer, after the cutting of the semiconductor substrate.

7. The method of manufacturing a semiconductor package of claim 1, wherein a plurality of semiconductor chips are formed during the cutting of the semiconductor substrate,
the method of manufacturing a semiconductor package further comprising pre-bonding the plurality of semiconductor chips on a wafer structure on which a plurality of semiconductor structures are formed.

8. The method of manufacturing a semiconductor package of claim 7, wherein each of the plurality of semiconductor structures comprises a first substrate structure, a first bonding insulating layer on the first substrate structure, and a first bonding pad exposed from the first bonding insulating layer,
wherein each of the plurality of semiconductor chips comprises a second substrate structure respectively formed by the cutting of the semiconductor substrate, a second bonding insulating layer on the second substrate structure, and a second bonding pad exposed from the second bonding insulating layer.

9. The method of manufacturing a semiconductor package of claim 8, wherein the first bonding pad and the second bonding pad are in contact with each other and are bonded by copper (Cu)-to-copper (Cu) bonding,
wherein the first bonding insulating layer and the second bonding insulating layer are in contact with each other and are bonded by dielectric-to-dielectric bonding.

10. The method of manufacturing a semiconductor package of claim 1, wherein the exposing of the portion of the insulating layer comprises using plasma gas including at least one of $O_2$, $N_2$, Ar, and $C_xF_y$.

11. A method of manufacturing a semiconductor package, comprising:
forming a first structure including a first bonding structure;
forming a second structure including a second bonding structure; and
bonding the first structure and the second structure so that the first bonding structure and the second bonding structure are in direct contact with each other,
wherein at least one of the forming of the first structure and the forming of the second structure comprises
forming a mask layer on a wafer, the wafer including a semiconductor substrate and an insulating layer,
forming a groove in the semiconductor substrate by performing a first laser grooving process,
expanding an opening of the mask layer opened by the first laser grooving process by performing a second laser grooving process,
exposing a portion of the insulating layer by removing a portion of the mask layer,
cutting the semiconductor substrate while removing the portion of the insulating layer exposed during the exposing by performing a dicing process, and
removing the mask layer.

12. The method of manufacturing a semiconductor package of claim 11, wherein, when the first laser grooving process is performed, burrs protruding upwardly from the insulating layer are formed,
wherein the burrs of the insulating layer are exposed from a side surface of the mask layer, and are removed by the dicing process.

13. The method of manufacturing a semiconductor package of claim 11, wherein the exposing the portion of the insulating layer comprises removing residue of the mask layer covering the portion of the insulating layer using plasma gas.

14. The method of manufacturing a semiconductor package of claim 11, wherein the removing the portion of the insulating layer during the dicing process provides a flat bonding surface without unevenness on at least one of the first bonding structure and the second bonding structure.

15. The method of manufacturing a semiconductor package of claim 11, wherein the dicing process comprises a plasma etching process performed using the mask layer as an etching mask.

16. The method of manufacturing a semiconductor package of claim 11, wherein the first laser grooving process has an average output of power greater than that an average output of power of the second laser grooving process, and the first laser grooving process has a scan speed slower than a scan speed of the second laser grooving process.

17. The method of manufacturing a semiconductor package of claim 11, wherein an undercut or unevenness is formed on a cut surface of the semiconductor substrate during the dicing process.

18. The method of manufacturing a semiconductor package of claim 11, wherein the bonding of the first structure and the second structure comprises die-to-die bonding or die-to-wafer bonding.

19. A method of manufacturing a semiconductor package, comprising:
   forming a first structure including a plurality of semiconductor structures;
   forming a second structure including a semiconductor chip; and
   bonding the second structure to the first structure,
   wherein the forming the second structure comprises
      forming a mask layer on a wafer, the wafer including a semiconductor substrate and an insulating layer,
      forming a groove in the semiconductor substrate by performing a first laser grooving process along a scribe lane of the semiconductor substrate,
      removing a portion of the mask layer by performing a second laser grooving process on a region larger than a region of the first laser grooving process,
      removing residue of the mask layer remaining on the insulating layer after the second laser grooving process,
      forming a plurality of semiconductor chips including the semiconductor chip by performing a dicing process using the mask layer as an etching mask, and
      removing the mask layer.

20. The method of manufacturing a semiconductor package of claim 19, wherein, when the first laser grooving process is performed, burrs protruding upwardly from the insulating layer are formed,
   wherein the burrs of the insulating layer are exposed from a side surface of the mask layer, and are removed by the dicing process.

* * * * *